(12) United States Patent
Chen

(10) Patent No.: US 6,759,691 B2
(45) Date of Patent: Jul. 6, 2004

(54) ESD PROTECTION CIRCUIT HAVING A HIGH TRIGGERING THRESHOLD

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/219,442

(22) Filed: Aug. 15, 2002

(65) Prior Publication Data

US 2003/0052332 A1 Mar. 20, 2003

(30) Foreign Application Priority Data

Aug. 16, 2001 (TW) ........................ 090120068 A

(51) Int. Cl.⁷ ........................ H01L 29/74; H01L 31/111; H01L 23/62

(52) U.S. Cl. ........................ 257/107; 257/167; 257/168; 257/173; 257/355

(58) Field of Search ........................ 257/107, 167, 257/168, 173, 355

(56) References Cited

U.S. PATENT DOCUMENTS

| 6,459,127 B1 | * | 10/2002 | Lee et al. | 257/355 |
| 6,576,959 B2 | * | 6/2003 | Kunz et al. | 257/355 |
| 2003/0038298 A1 | * | 2/2003 | Cheng et al. | 257/107 |

* cited by examiner

Primary Examiner—Jerome Jackson
Assistant Examiner—Joseph Nguyen
(74) Attorney, Agent, or Firm—Birch, Stewart, Kolasch & Birch LLP

(57) ABSTRACT

An ESD protection circuit having a high triggering threshold. The ESD protection circuit comprises a semiconductor-controlled rectifier (SCR) and a bipolar-junction-transistor (BJT). The SCR comprises an anode, an anode gate, a cathode gate and a cathode. The anode is coupled to a first pad. The cathode gate and the cathode are coupled to a second pad. The BJT transistor is parasitic under a metal-on-semiconductor (MOS) transistor and has a collector and an emitter. Either the collector or the emitter is coupled to the anode gate, and the other is coupled only to the second pad. Current generated at the anode is shared by the BJT transistor. A larger current is required to trigger the SCR in the ESD protection circuit of the present invention and result in a latch-up. Thus, latch-up caused by accidental noise is prevented during normal power operations.

17 Claims, 5 Drawing Sheets

US 6,759,691 B2

ESD PROTECTION CIRCUIT HAVING A HIGH TRIGGERING THRESHOLD

Pursuant to 35 U.S.C. 119(a)–(d), this application claims priority from Taiwanese application no. 090120068, filed with the Taiwanese Patent Office, Taiwan, on Aug. 16, 2001.

BACKGROUND OF THE INVENTION

1. Field of the Invention

The present invention relates in general to an electrostatic discharge (ESD) protection circuit utilizing a semiconductor-controlled rectifier (SCR). In particular, the present invention relates to an ESD protection circuit having a high triggering threshold.

2. Description of the Related Art

ESD protection is an important issue for semiconductor products, and is especially crucial during manufacture of minimized complementary metal oxide semiconductors (CMOSs). Breakdown voltages of gate oxide layers in MOS transistors have decreased as the manufacturing process has improved. In order to protect the gate oxide layer from ESD stress, an ESD protection circuit is formed at each input/output (I/O) port as a general security measure.

A semiconductor-controlled rectifier (SCR) is often used as an ESD protection component for its low holding voltage. FIG. 1 shows a cross section of a conventional lateral SCR. As shown in FIG. 1, a PNPN structure is formed by a P+ doped region 14, an N-well 12, a P-substrate 10 and an N+ doped region 18. The N-well 12 is coupled to the P+ doped region 14 through an N+ doped region 16 to become an anode of the SCR. The P-substrate 10 is coupled to the N+ doped region 18 through a P+ doped region to become a cathode of the SCR. FIG. 2 is a voltage-current diagram of the conventional SCR in FIG. 1. The triggering voltage is approximately equal to the junction-breakdown voltage between the N-well 12 and the P-substrate 10 (approximately larger than 10V). The holding voltage $V_{hold}$ is about 1V. The thermal energy generated by an ESD protection component during an ESD event is approximately equal to $I_{ESD} \times V_{ESD}$. The voltage $V_{ESD}$ generated by a conventional SCR during an ESD event is relatively low, approximately equal to the holding voltage $V_{hold}$. Therefore, a conventional SCR conducts large current without becoming overheated and thus is suitable for ESD protection.

It is noted that the triggering current $I_{trig}$ of a conventional SCR is rather small as shown in FIG. 2. When used as an ESD protection component at a pad, the conventional SCR is easily triggered and latched up by noise during normal power operations. The pad is clamped to a low voltage (~$V_{hold}$) and signal transmissions at the pad are interrupted.

SUMMARY OF THE INVENTION

The ESD protection circuit of the present invention has a high triggering threshold to overcome the problems caused by latch-up.

An ESD protection circuit of the present invention having a high triggering threshold comprises a semiconductor-controlled rectifier (SCR) and a bipolar-junction transistor (BJT). The SCR comprises an anode, an anode gate, a cathode gate and a cathode. The anode is coupled to a first pad. The cathode gate and the cathode are coupled to a second pad. The BJT is parasitic under a metal-on-semiconductor (MOS) transistor and has a collector and an emitter. Either the collector or the emitter is coupled to the anode gate, and the other is coupled only to the second pad.

Another ESD protection circuit of the present invention comprises a gate-grounded NMOS transistor and a lateral SCR. The lateral SCR comprises a substrate having a first conductivity type, a well region having a second conductivity type, a first doped region having the first conductivity type, and a second doped region having the second conductivity type. The gate-grounded NMOS transistor comprises a drain coupled only to the well region, and a gate and a source coupled together. The first doped region is coupled to a first pad. The second doped region, the source and the gate of the gate-grounded NMOS transistor are coupled to a second pad.

The ESD protection circuit of the present invention provides good ESD protection and prevents latch-up caused by accidental noise during normal power operations.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 3:
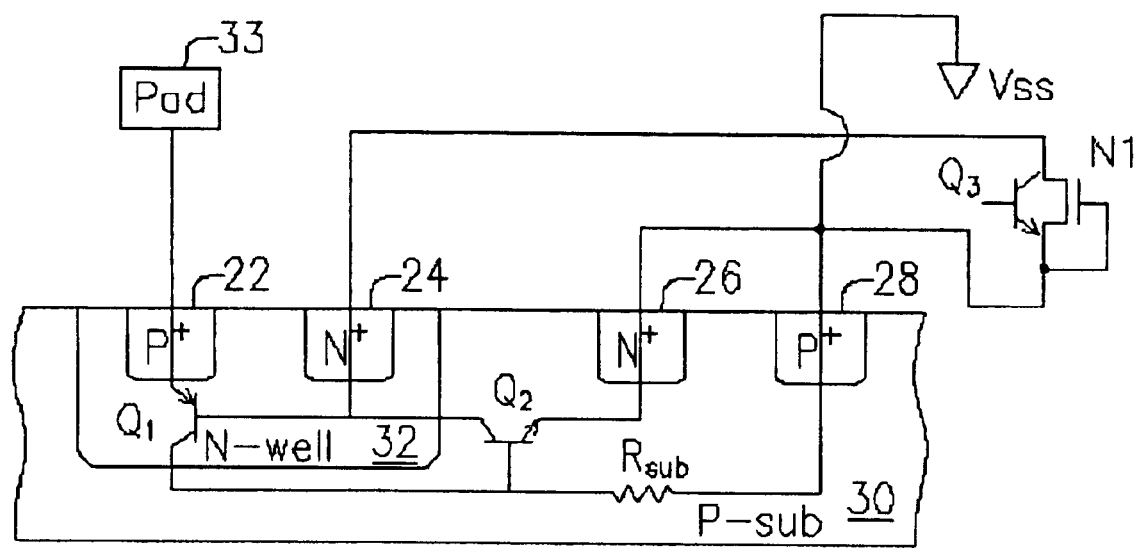
FIG. 3 is a cross section of an ESD protection circuit of the present invention.
Figure 4:
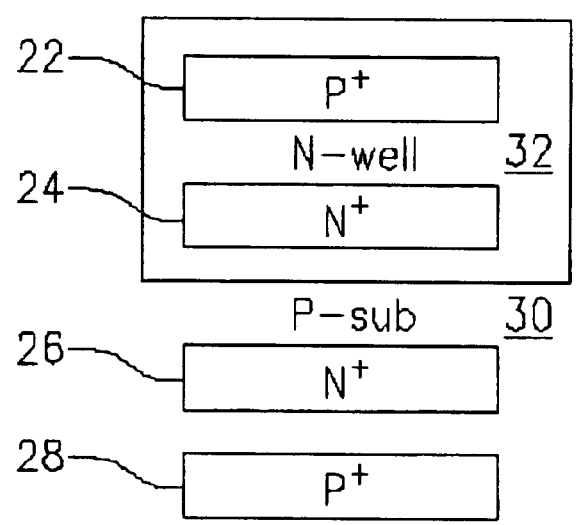
FIG. 4 shows a layout of the SCR in FIG. 3.

A cross section of an ESD protection circuit of the present invention is shown in FIG. 3. The ESD protection circuit of the present invention comprises two components, a lateral SCR and an NMOS N1. The layout of the lateral SCR in FIG. 3 is shown in FIG. 4. As shown in FIGS. 3 and 4, a PNPN structure of the lateral SCR is formed by a P+ doped region 22, an N-well 32, a P-substrate 30 and an N+ doped region 26 as the anode, anode gate, cathode gate and cathode of the SCR. The P+ doped region 22 is coupled to a pad 33. The P-substrate 30 is coupled to a power line VSS via a P+ doped region 28. The power line is coupled to a power pad not shown. The N-well 32 is exclusively coupled to the drain of the NMOS N1 through an N+ doped region 24. The P+ doped region 22, the N+ doped region 24, the N+ doped region 26 and the P+ doped region 28 are approximately parallel as shown in FIG. 4. FIG. 3 also represents the equivalent component diagram of the lateral SCR.

Figure 5:
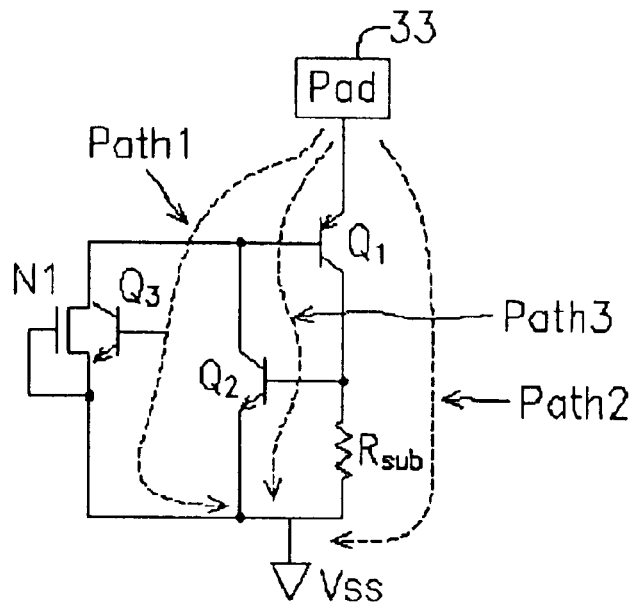
FIG. 5 shows the connections of the equivalent components in FIG. 3.

The connections between the equivalent components in FIG. 3 are shown in FIG. 5. Q1 is a perpendicular PNP bipolar junction transistor (BJT) formed by the P+ doped region 22, the N-well 32 and the P-substrate 30. Q2 is a lateral npn BJT formed by the N-well 32, the P-substrate 30 and the N+ doped region 26. Q3 is an npn BJT parasitic under the channel of the NMOS N1. The symbol $R_{sub}$ represents a spread resistance formed by the P-substrate 30 between the base of the lateral npn BJT Q2 and the power line VSS.

As shown in FIG. 5, when a positive ESD pulse occurs at the pad 33 and the power line VSS is grounded, the junction between the collector and the base of the parasitic npn BJT Q3 is broken down causing snapback. A small amount of the ESD current is conducted through a path path1. Meanwhile, the junction between the emitter and the base of the pnp BJT Q1 is forward-biased so that the pnp BJT is turned on and the ESD current is partially released to the ground through a path path2. That is, the ESD current is released through the paths path1 and path2 when the ESD protection circuit of the present invention is initially triggered. As the ESD current flowing through the path path2 increases, the voltage at the base of the lateral npn BJT Q2 increases as well. Once the voltage at the base of the lateral npn BJT Q2 surpasses a triggering voltage, the lateral npn BJT Q2 is turned on to form an ESD current path path3. A latch-up effect caused by triggering the BJTs Q1 and Q2 (the lateral SCR) releases the ESD stress at a low voltage across the pad 33.

Figure 6:
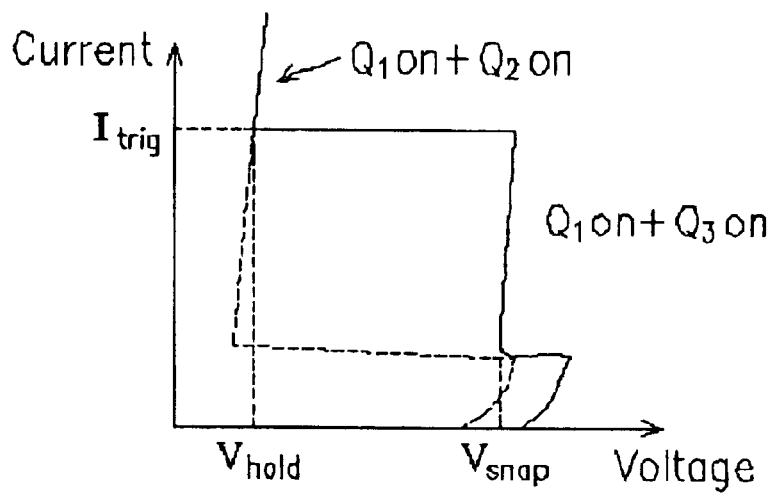
FIG. 6 is a corresponding voltage-current diagram of the circuit in FIG. 5.

FIG. 6 is a corresponding voltage-current diagram of the circuit in FIG. 5. The horizontal axis shows the voltage across the pad 33 relative to the ground. The vertical axis shows the current input at the pad 33. When snap-back occurs, the BJTs Q1 and Q3 are turned on and the voltage at the pad 33 is held at a snap-back voltage $V_{snap}$ by the ESD protection circuit of the present invention, as shown in FIG. 6. When the current surpasses a triggering current $I_{trig}$, the lateral SCR is then turned on to keep the voltage across the pad 33 at a low holding voltage $V_{hold}$.

The snap-back voltage $V_{snap}$ is determined by the NMOS N1, and the triggering voltage $I_{trig}$ is determined by the lateral SCR and the NMOS N1. Namely, the snap-back voltage $V_{snap}$ and the triggering current $I_{trig}$ are adjusted in accordance with the lateral SCR and the NMOS N1. A proper layout of the circuit allows the snap-back voltage $V_{snap}$ and the triggering current $I_{trig}$ to respectively exceed the maximum voltage ($V_{dd}$ for instance) and the maximum current at the pad 33 under normal power operations. As shown in FIG. 6, when the pad 33 is momentarily overstressed by an external noise, BJTs Q1 and Q3 of the ESD protection circuit of the present invention are temporarily turned on to prevent latch-up (the activation of the lateral SCR). The current caused by external noise is usually negligible in comparison with the normal operating current of the pad. Once the noise fades away, the operating voltage of the pad 33 is too small (in comparison with the snap-back voltage $V_{snap}$) for the BJTs Q1 and Q3 of the ESD protection circuit to remain triggered and the ESD protection circuit regains its status as an open circuit to allow the pad 33 to transmit signals.

During an ESD event, the large ESD current triggers the lateral SCR of the ESD protection circuit of the present invention. The ESD current is released at a low holding voltage ($V_{hold}$) to protect the ESD protection circuit of the present invention from high ESD stress.

Figure 7:
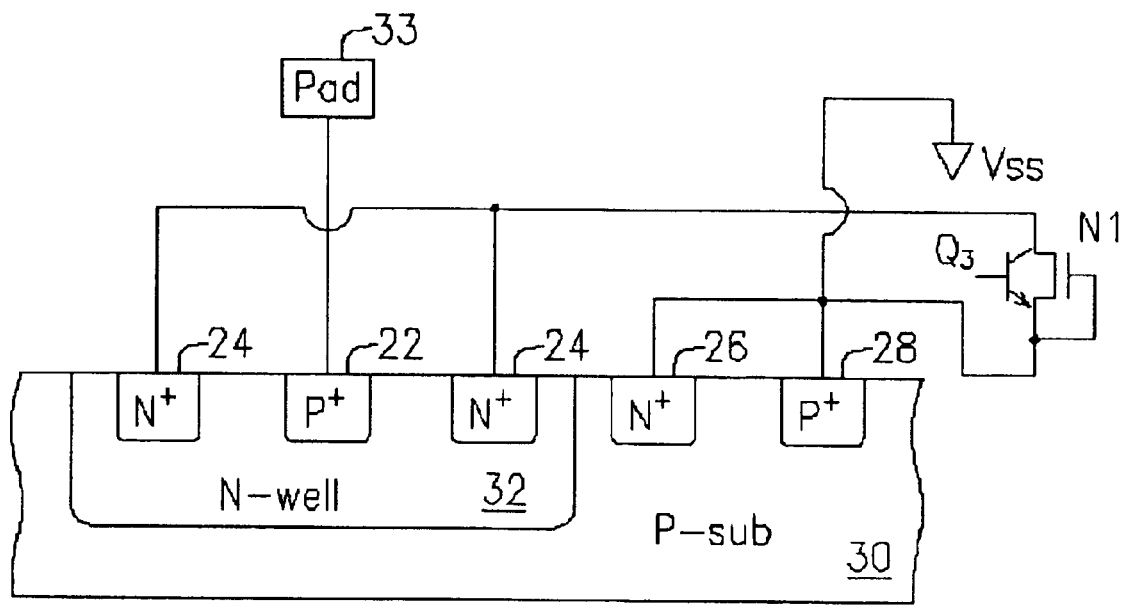
FIG. 7 is a cross section of anther ESD protection circuit of the present invention.
Figure 8:
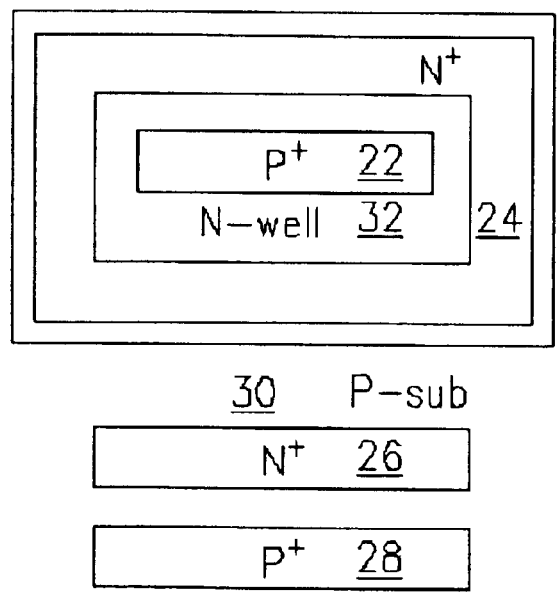
FIG. 8 is a layout of the SCR in FIG. 7.

FIG. 7 is a cross section of another ESD protection circuit of the present invention. FIG. 8 is a layout of the SCR in FIG. 7. A N+ dope region 24 may embody the P+ doped region 22. Compared with the layout in FIG. 3, the silicon area in FIG. 7 has a higher triggering current $I_{trig}$ to prevent latch-up caused by external noise.

The transistor N1 can be a gate-grounded NMOS transistor or a gate-grounded N-type field MOS transistor with a gate-isolating layer formed by field oxide. Both types have an npn BJT parasitic near the channel areas.

Figure 9:
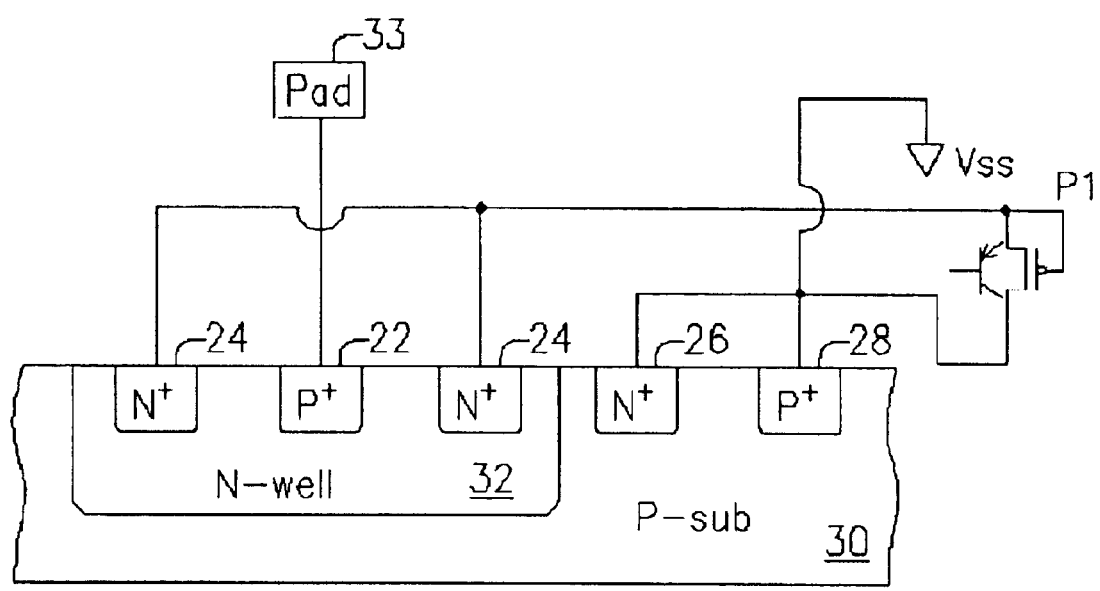
FIG. 9 is a schematic diagram of an ESD protection circuit implemented by a PMOS.

The NMOS transistor N1 in FIG. 7 can be replaced with a PMOS transistor as shown in FIG. 9. The source of the PMOS transistor P1 is coupled to the gate, and is also an emitter of a pnp BJT parasitic under the PMOS transistor P1 transistor. The drain of the PMOS transistor P1 is coupled to a power plane VSS, and is also the collector of the parasitic pnp BJT. Alternatively, a p-type field MOS transistor is used to implement the ESD protection circuit of the present invention.

Figure 1:
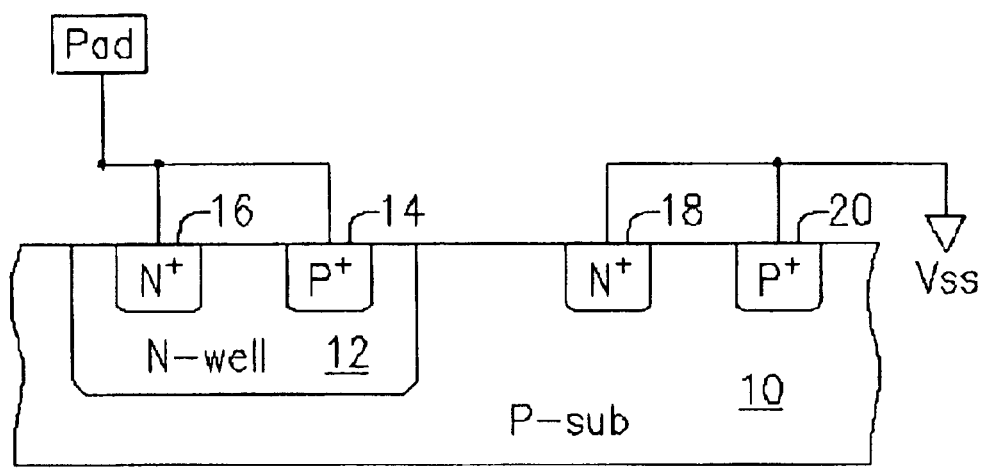
FIG. 1 is a cross section of a conventional SCR.
Figure 2:
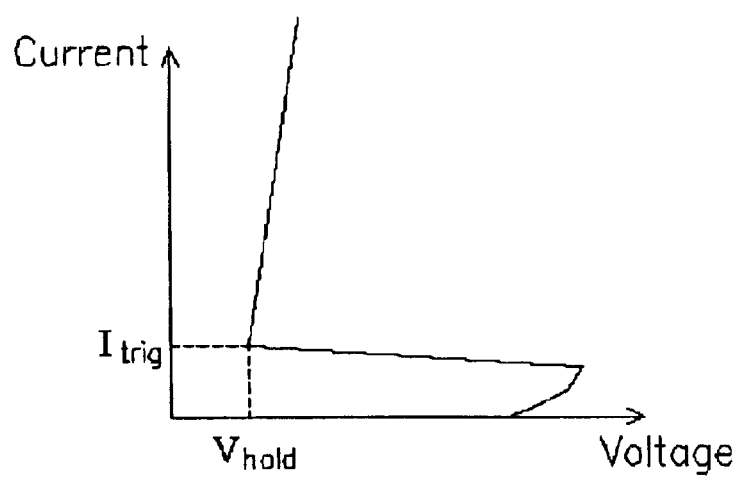
FIG. 2 is a voltage-current diagram of the conventional SCR in FIG. 1.

The ESD protection circuit of the present invention provides good ESD protection. With proper layout configurations, the ESD protection circuit of the present invention prevents latch-up caused by external noise, and solves the problems encountered in a traditional lateral SCR as illustrated in FIG. 1.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An ESD protection circuit having a high triggering threshold, comprising:

a semiconductor controlled rectifier (SCR), the SCR comprising an anode, an anode gate, a cathode gate and a cathode, the anode coupling to a first pad, the cathode gate and the cathode coupling to a second pad; and a bipolar junction transistor (BJT) parasitic under a metal-on-semiconductor (MOS), having a collector and an emitter, wherein the MOS is not parasitic under the SCR;

wherein either the collector or the emitter is coupled to the anode gate, and the other is coupled only to the second pad, and the MOS is not connected to the first pad.

2. The ESD protection circuit in claim 1, wherein the SCR is a lateral SCR formed on a substrate.

3. The ESD protection circuit in claim 1, wherein the BJT is parasitic under a gate-grounded N-type MOS (GGNMOS) transistor, the collector being a drain of the GGNMOS transistor and the emitter being a source of the GGNMOS transistor.

4. The ESD protection circuit in claim 1, wherein the BJT is parasitic under a P-type MOS (PMOS) transistor, the gate coupled to a source of the PMOS transistor, the collector being a drain of the PMOS transistor and the emitter being the source of the PMOS transistor.

5. The ESD protection circuit in claim 1, wherein either the first pad or the second pad is a power line, and the other is an input/output (I/O) port.

6. An ESD protection circuit, comprising:

a lateral SCR, comprising:

a substrate having a first conductivity type;

a well region having a second conductivity type;

a first doped region having the first conductivity type; and a second doped region having the second conductivity type; and a gate-grounded NMOS transistor comprising:

a drain, coupled only to the well region; and a gate and a source coupled together;

wherein the gate-ground NNOS is not parasitic under the lateral SCR, the first doped region is coupled to a first pad, and the substrate, the second doped region, the source and the gate of the gate-grounded NMOS transistor are coupled to a second pad, and the gate-ground NMOS is not connected to the first pad.

7. The ESD protection circuit in claim 6, wherein the lateral SCR further comprises a third doped region having the first conductivity type, the third doped region coupling the substrate to the second pad.

8. The ESD protection circuit in claim 6, wherein the lateral SCR further comprises a fourth doped region formed in the well region and of the second conductivity type, the well region coupled to the drain of the gate-grounded NNOS only through the fourth doped region.

9. The ESD protection circuit in claim 8, wherein the fourth doped region surrounds the first doped region.

10. The ESD protection circuit in claim 8, wherein the first doped region, the second doped region, the third doped region and the fourth doped region are approximately parallel on the substrate.

11. The ESD protection circuit in claim 6, wherein the lateral SCR further comprises a third doped region formed on the substrate and having the first conductivity type, the second doped region formed between the third doped region and the well region, the substrate coupled to the second pad through the third doped region.

12. An ESD protection circuit, comprising:
 a lateral SCR, comprising:
  a substrate of a first conductivity type;
  a well region of a second conductivity type;
  a first doped region of the first conductivity type; and
  a second doped region of the second conductivity type; and
 a PMOS transistor comprising:
  a gate and a source both coupled to the well region; and
  a drain;
  wherein the PMOS is not parasitic under the lateral SCR, the first doped region is coupled to a first pad, and the substrate, the second doped region, the drain of the PMOS transistor are coupled to a second pad.

13. The ESD protection circuit in claim 12, wherein the lateral SCR further comprises a third doped region of the first conductivity type, the third doped region coupling the substrate to the second pad.

14. The ESD protection circuit in claim 12, wherein the lateral SCR further comprises a fourth doped region formed in the well region and of the second conductivity type, the well region coupled to the source and the gate of the PMOS only through the fourth doped region.

15. The ESD protection circuit in claim 14, wherein the fourth doped region surrounds the first doped region.

16. The ESD protection circuit in claim 14, wherein the first doped region, the second doped region, the third doped region and the fourth doped region are approximately parallel on the substrate.

17. The ESD protection circuit in claim 12, wherein the lateral SCR further comprises a third doped region formed on the substrate, of the first conductivity type, the second doped region formed between the third doped region and the well region, the substrate coupled to the second pad through the third doped region.

* * * * *